United States Patent [19]

Yokoyama et al.

[11] Patent Number: 4,897,709

[45] Date of Patent: Jan. 30, 1990

[54] TITANIUM NITRIDE FILM IN CONTACT HOLE WITH LARGE ASPECT RATIO

[75] Inventors: Natsuki Yokoyama, Mitaka; Yoshio Homma, Tokyo; Kenji Hinode; Kiichiro Mukai, both of Hachioji, all of Japan

[73] Assignee: Hitachi, Ltd., Tokyo, Japan

[21] Appl. No.: 199,269

[22] Filed: May 26, 1988

[30] Foreign Application Priority Data

Apr. 15, 1988 [JP] Japan ................... 63-91556

[51] Int. Cl.$^4$ ............................................. H01L 23/48
[52] U.S. Cl. ....................... 357/68; 357/54; 357/55; 357/71; 357/23.6; 437/197; 437/203; 437/243; 437/190
[58] Field of Search ............... 357/68, 54, 54 N, 71, 357/55, 55 R, 55 C, 23.6; 437/197, 203, 190, 243

[56] References Cited

U.S. PATENT DOCUMENTS

| | | | |
|---|---|---|---|
| 4,556,897 | 12/1985 | Yorikane et al. | 357/54 X |
| 4,570,328 | 2/1986 | Price et al. | 29/571 |
| 4,743,953 | 5/1988 | Toyokura et al. | 357/54 X |
| 4,782,380 | 11/1988 | Shankar et al. | 357/68 X |
| 4,784,973 | 11/1988 | Stevens et al. | 437/190 X |

FOREIGN PATENT DOCUMENTS 61-69969 4/1986 Japan .

OTHER PUBLICATIONS

Kahelus et al, "Bias-Induced Stress Transitions in Sputtered Tin Films", J. Vac. Sci. Technol. A, vol. 4, No. 4, Jul./Aug. 1986, pp. 1850–1854.

"Tin Formed by Evaporation as a Diffusion Barrier Between Al and Si", Ting, J. Vac. Sci.Technol. 21(1), May/Jun. 1982, pp. 14–18.

*Primary Examiner*—William Mintel
*Attorney, Agent, or Firm*—Antonelli, Terry & Wands

[57] ABSTRACT

A semiconductor device includes a titanium nitride film as a barrier which is formed in a hole. The width or diameter of the hole is smaller than 1 μm, and the aspect ratio thereof is larger than 0.7. The sidewall of the hole is substantially perpendicular to the surface of a semiconductor substrate. By the low pressure CVD method with a cold wall type CVD apparatus, it becomes possible to form the titanium nitride film having excellent characteristics with a good step coverage in a considerably fine hole having a large aspect ratio.

12 Claims, 6 Drawing Sheets (200) PEAK HEIGHT / (111) PEAK HEIGHT
- ○ FORMED BY LPCVD
- ● FORMED BY BIAS PLASMA CVD
- △ FORMED BY REACTIVE SPUTTEING

TITANIUM NITRIDE FILM IN CONTACT HOLE WITH LARGE ASPECT RATIO

BACKGROUND OF THE INVENTION

The present invention relates to a semiconductor device and a method for fabricating the same. More particularly, the present invention relates to a semiconductor device, in which a titanium nitride film having excellent characteristics is formed on the surface of windows, holes or grooves having a width or diameter, depending on the shape of the window, hole or groove opening (in this specification they are called holes having a diameter generically). The present invention is especially directed to providing such film in holes having a large aspect ratio (height of hole/minimum diameter of hole), and a method for fabricating the same.

Recently, with remarkable increase in integration density in semiconductor devices, the diameter of contact holes has become significantly smaller and regions doped with impurity formed in the surface portion of semiconductor substrates have become very much thinner When wiring made of an aluminium or aluminium alloy film is connected with the surface of such a considerably thin region doped with impurity through a contact hole and heat treatment is effected in order to increase the reliability of the devices, aluminium is diffused into the impurity doped region and pierces through the p-n junction, which gives rise to a difficulty that the p-n junction is destroyed.

In order to remove such a difficulty, a method has been proposed, by which reaction between aluminum and the semiconductor substrate is prevented by interposing a barrier layer made of titanium nitride between the wiring made of aluminium or alloy thereof and the surface of the semiconductor substrate.

Since titanium nitride has a relatively low resistivity has excellent in stability at high temperatures and is chemically stable, it is possible to prevent a reaction between the wiring and the semiconductor substrate and to improve the reliability of the semiconductor device by using titanium nitride as a barrier layer.

Heretofore a reactive sputtering method has been most widely used for fabricating a titanium nitride film. Since it is difficult to obtain a high purity titanium nitride target for sputtering the film using pure Argon, a method for fabricating a titanium nitride film, by which a high purity titanium target is used and titanium is made to react with nitrogen in a discharge gas, is usually utilized. The formation of a titanium nitride film by such a reactive sputtering method is disclosed in J. Vac. Sci. Technol., A4(4), 1986, pp 1850-1854.

On the other hand, when the width or the diameter of the holes described above is very small and the aspect ratio (height of hole/minimum diameter of hole) is large, it is considerably difficult to form a titanium nitride film having an appropriate film thickness on the inner surface of such a hole by the reactive sputtering method described above.

That is, when a titanium nitride film is formed by the reactive sputtering method, the thickness of the titanium nitride film is not uniform, and is very small around the bottom portion of the hole, which decreases remarkably performance of the film as a barrier layer. Further, since the thickness of the titanium nitride film thus obtained is not uniform and has a profile, with an overhang when aluminium or an aluminium alloy is deposited thereon to form the wiring, cavities or voids are formed therein, which decreases the reliability of the semiconductor device produced.

As methods for fabricating a titanium nitride, film apart from the reactive sputtering method, there have been proposed an evaporation method (J. Vac. Sci. Technol., 21(1), May/June, 1982, pp. 14–18) and a low pressure CVD method (U.S. Pat. No. 4,570,328, JP-A-61-69969). However, in these literatures, the formation of a titanium nitride film having a uniform thickness on the inner surface of a considerably fine hole having a large aspect ratio, and the property of the titanium nitride layer thus formed as the barrier, are not mentioned; and it is strongly desired to find a method for fabricating a semiconductor device provided with a titanium nitride film, which has a uniform thickness and is excellent in its property as a barrier, on the inner surface of a fine hole having a large aspect ratio in such a semiconductor device.

SUMMARY OF THE INVENTION

The object of the present invention is to resolve the problem described above of the prior art techniques. More specifically, the object is to provide a semiconductor device having a high integration density and high reliability, in which a titanium nitride film having a uniform thickness and an excellent property as a barrier is provided on the inner surface of an extremely fine hole, whose side wall is substantially perpendicular to the upper surface of the semiconductor substrate and which has a large aspect ratio, and a method for fabricating each device.

In order to achieve the above object, according to the present invention, a titanium nitride film, whose thickness at the thinnest portion within the hole is more than 0.6 times as large as the film thickness on the flat portion outside of the hole, is formed on the inner surface of the hole, whose width or diameter is smaller than 1 μm and whose aspect ratio is larger than 0.7. Such film is found by the low pressure CVD method, and by which the temperature of the semiconductor substrate is maintained higher than that of the inner wall of a CVD chamber. Furthermore, in the case in which the low pressure CVD is carried out, it is possible to obtain a titanium nitride film having an excellent film property owing to the fact that the temperature of the semiconductor substrate, on which the titanium nitride film is to be formed, is maintained higher than that of the inner wall of the reaction chamber of the CVD apparatus. That is, by using the low pressure CVD, the coverage of the titanium nitride is improved with respect to that obtained in the case where the reactive sputtering method is used, and it is possible to form a good titanium nitride film within the fine hole described above, which was impossible by other methods. At this time, it has been found that, when the temperature of the semiconductor substrate is higher than that of the inner surface of the wall of the reaction chamber and the low pressure CVD is carried out (this method is called the cold wall method), a better step coverage and better characteristics as a barrier for preventing the reaction between aluminium and silicon can be obtained than that obtained when the hot wall method is used, by which the temperature of the inner wall surface of the reaction chamber is higher than that of the semiconductor substrate. That is, it has been found that, when the temperature of the semiconductor substrate is kept to be lower than that of the wall surface of the reaction chamber and the titanium nitride film is deposited by the low pressure CVD method, e.g. as disclosed in U.S. Pat. No. 4,570,328 stated above, although the step coverage is slightly better than that obtained by the reactive sputtering method it is difficult to form a good titanium nitride film on the inner surface of an considerably fine hole, whose diameter is smaller than 1 μm and whose aspect ratio is larger than 0.7.

Further, it has been recognized that, when titanium tetrachloride is used as the primary material gas and the low pressure CVD is carried out by means of a similar apparatus, the titanium nitride film thus obtained contains chlorine of about 10 at % and the property of the barrier preventing the reaction between aluminium and silicon is considerably poor.

However such a problem has been resolved, according to the present invention, by carrying out the low pressure CVD in a state where the temperature of the semiconductor substrate is kept to be higher than that of the inner wall surface of the reaction chamber, and it has been verified that it is possible to form a titanium nitride film having good characteristics as the barrier with a good step coverage on the inner surface of the fine hole stated above. It has been also confirmed that such an excellent result can be obtained not only when titanium tetrachloride is used as primary material gas for titanium, but also when an organic titanium compound such as tetradimethylmethylamine titanium, etc. is used therefor.

DESCRIPTION OF THE PREFERRED EMBODIMENTS

Embodiment 1

As indicated in FIG. a, a hole 10, 5 μm deep, having a diameter of 0.85 μm, was formed in a monocrystalline silicon substrate 11 by the well known reactive ion etching, using a photosensitive resin layer as a mask, and thereafter the photosensitive resin layer was removed by a well known ashing method.

Figure 2:
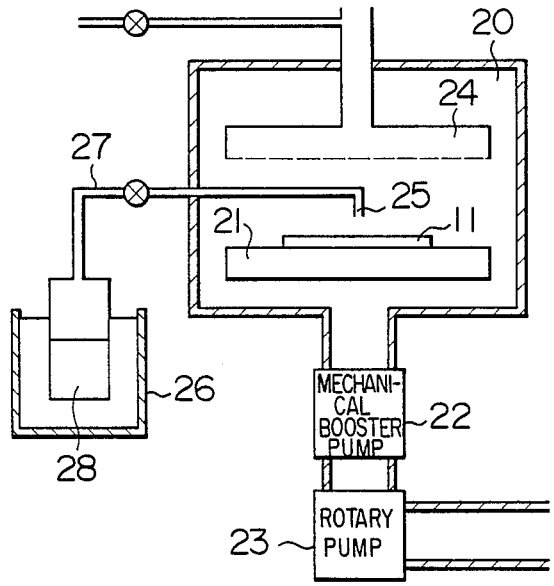
FIG. 2 is a scheme showing an example of a CVD apparatus used for realizing the present invention.

The substrate 11 stated above was placed on a substrate holder 21, which was disposed in a reaction chamber 20 of an apparatus indicated in FIG. 2 and in which a heater was built-in, after having been subjected to a well known cleaning treatment. The reaction chamber 20 was evacuated by means of a mechanical booster pump 22 and a rotary pump 23 so as to obtain a vacuum of $2.0 \times 10^{-3}$ Torr. The built-in heater was driven so as to keep the temperature of the substrate 11 stated above at 700° C. A titanium nitride layer was formed on the surface of the silicon substrate 11 while introducing titanium tetrachloride through a gas inlet 25 and ammonia through a gas nozzle 24 in the reaction chamber 20. The flow rate of titanium tetrachloride and that of ammonia were 9 SCCM (standard cubic centimeter per minute) and 900 SCCM, respectively, and the pressure within the reaction chamber 20 was kept at 0.35 Torr. Titanium tetrachloride 28 was vaporized within a vessel 26 kept at 25° C., passed through a pipe 27 kept at 45° C., and was introduced to the surface of the substrate 11 through the gas inlet 25. The temperature of the inner wall of the reaction chamber 20 was raised to 150°–200° C. by means of a heater in order to prevent the deposition of ammonium chloride on the inner wall.

Figure 1A:
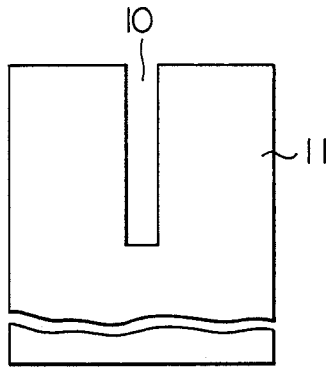
FIGS. 1a to 1c are cross-sectional views illustrating the fabrication steps indicating an embodiment of the present invention.
Figure 1B:
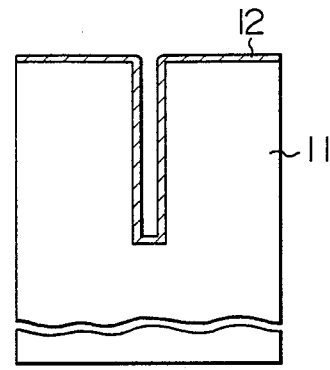
Figure 1C:
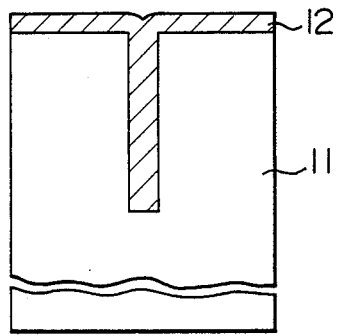

Under the conditions described above the formation of the titanium nitride layer was carried out for 8 minutes and the introduction of titanium tetrachloride and ammonia was stopped. After having stopped the feeding of the heater built-in in the substrate holder 21 with electric current, the reaction chamber 20 was purged with nitrogen gas and the substrate 11 was cooled to 100° C. The substrate 11 was taken out and examined. As indicated in FIG. 1b, the titanium nitride film 12 was formed not only on the upper surface of the substrate but also on the inner surface of the hole 10, which was 200 nm thick on the flat upper surface and 160 nm thick at the thinnest portion in the hole 10. In the case where the duration of the formation of the titanium nitride film was reduced to 5 minutes, the titanium nitride film was 125 nm thick on the flat upper surface and 100 nm thick at the thinnest portion in the hole 10. In either case it was confirmed that it is possible to form a good titanium nitride film on the inner surface of a hole, whose diameter is considerably small and whose aspect ratio is large. Further, when the deposition of titanium nitride was carried out for 18 minutes, the titanium nitride film was 450 nm thick on the upper surface and the groove 10 was totally filled with titanium nitride 12, as indicated in FIG. 1c.

Although the formation of the titanium nitride thin film described above was effected at 700° C., it can be effected at any temperature between 200° C. and 900° C. However a desirable temperature region is comprised between 400° C. and 900° C. This is because a titanium nitride thin film formed with a substrate temperature lower than 400° C. includes chlorine at a ratio greater than 2 at %. The resistivity of the titanium nitride thin film becomes lower and the property as a barrier becomes better with decreasing amounts of chlorine contained in the film. Although the pressure in the reaction chamber during the formation of the titanium nitride thin film may be from 0.01 Torr to 10 Torr, the highest step coverage can be obtained for a pressure region between 0.01 Torr and 1 Torr. It was possible to form a good titanium nitride thin film, if flow rates of titanium tetrachloride and ammonia was comprised between 1 SCCM and 1 SLM and between 10 SCCM and 50 SLM, respectively, for the apparatus indicated in FIG. 2. It is sufficient for the starting material apart from the combination of titanium tetrachloride and ammonia, to have the combination of titanium tetrachloride, at least one of and compounds including no nitrogen such as cyclo-pentadienyl compound, etc.; and at least one material selected from the group consisting of ammonia, nitrogen, hydrazine and nitrogen trifluoride. Concerning the temperature of the inner wall of the reaction chamber 20 during the formation of the titanium nitride thin film, the amount of ammonium chloride formed and deposited decreases with increased heating temperature, starting from room temperature and when the temperature exceeds 350° C., the deposit becomes practically zero.

Figure 3:
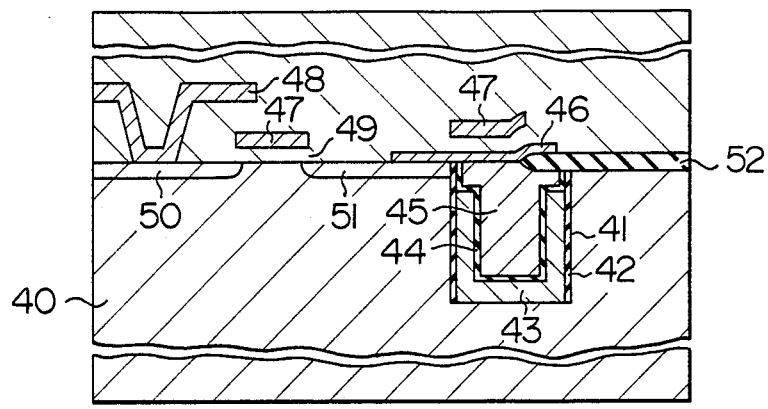
FIGS. 3 and 4 are cross-sectional views of two different embodiments of the present invention.

FIG. 3 shows a semiconductor device having a memory circuit consisting of MOS elements, each of which is provided with a trench-shaped capacitor having a titanium nitride thin film formed according to the present invention. A deep hole 41 3 $\mu$m deep, whose diameter is 0.7 $\mu$m, is formed in the surface portion of the silicon substrate 40 by dry etching method and an oxide film 42 is formed thereon. Thereafter, according to the method and under the conditions described above, a titanium nitride thin film 43, whose thickness is 100 nm on the flat portion, is formed by means of the apparatus indicated in FIG. 2 and subjected to necessary processing. The titanium nitride thin film 43 acts as a cell plate. A thin film 44 made of silicon dioxide or tantalum oxide serving as a dielectric film for the capacitor is formed on such a titanium nitride thin film 43 and subjected to necessary processing. Thereafter the deep hole was filled with polycrystalline silicon 45 doped with impurity. Further a silicon dioxide layer 52, a polycrystalline silicon layer 46, word lines 47 made of tungsten silicide, bit lines 48 made of polycrystalline silicon doped with impurity, and an interlayer insulating film 49 are formed. Reference numerals 50 and 51 represent diffusion layers formed by ion implantation with impurities at a high concentration.

The resistivity of the titanium nitride thin film described above is 115 $\mu\Omega$cm. Heretofore the resistivity of polycrystalline; doped with impurities was about 1 m$\Omega$·cm. By using titanium nitride, even if the film thickness of the cell plate was reduced to about ⅓ of that of a conventional polycrystalline silicon film it was possible to obtain a cell plate having a resistivity lower than that obtained by the prior art method. For this reason the semiconductor device using a titanium nitride thin film according to the present invention is made finer and has a better performance than the prior art device. The occupied area per cell is reduced to 87% with respect to that in the prior art device.

Embodiment 2

Figure 4:
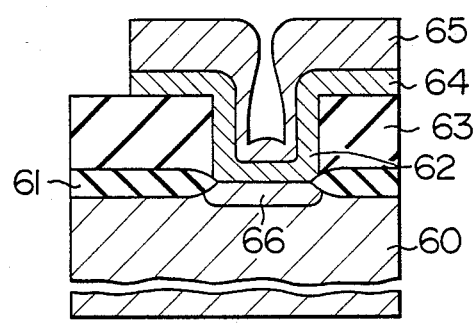

FIG. 4 is a schematic diagram for explaining the semiconductor device according to the present embodiment.

A silicon dioxide film 61 0.3 $\mu$m thick is formed on a silicon substrate 60 by the well known LOCOS method. Another silicon dioxide film 63 1 $\mu$m thick is formed on the substrate thus formed, in which film a contact hole 62 having a diameter of 0.9 $\mu$m is opened. Then a diffusion layer 66 ion-implanted with phosphorus at a high concentration is formed and thereafter a titanium nitride thin film 64 135 nm thick on the flat portion serving as a barrier layer is formed by a method and under conditions, which are similar to those used in Embodiment 1. The smallest thickness of the titanium nitride thin film 64 formed within the contact hole 62 is about 80% of that formed on the flat portion. Thereafter a thin film 0.5 $\mu$m thick principally made of aluminium containing silicon at 1% and copper at 0.5% was formed by the sputtering method, which was subjected to patterning by the usual photolithographic technique and the usual dry etching technique together with the titanium nitride thin film.

Figure 5:
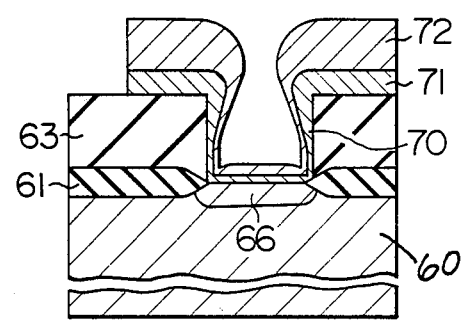
FIG. 5 is a cross-sectional view of a titanium nitride film formed by a prior art method.

FIG. 5 is a cross-sectional view of a semiconductor device formed by a prior art method. After having formed a contact hole 70 having the same size as that in the device indicated in FIG. 4, a titanium nitride thin film 71 135 nm thick at the flat portion was formed by the well known conventional reactive sputtering method. The thickness of the titanium nitride thin film 71 at the thinnest portion within the contact hole 70 is smaller than 40 nm. The thin film 72 0.5 $\mu$m thick principally made of aluminium was formed by the method and under the conditions, which were identical to those described for the above embodiment.

In the case of the structure indicated in FIG. 4, the contact resistance of the contact hole having a diameter of 0.7 $\mu$m is 278 $\Omega$, while it was 292 $\Omega$ in the case of the prior art structure indicated in FIG. 5. The resistance at the contact portion including the resistance of the thin film 65 principally made of aluminium in the structure according to the present invention is lower than that of the film 72 obtained by the prior art method. This is caused by the fact that the coverage of the thin film 65 principally made of aluminium differs from that of the film 72 in the prior art structure. This is because the smallest thickness of the thin film 65 principally made of aluminium formed on the titanium nitride thin film 64 according to the present invention and having a high step coverage within the contact hole is larger than that of the relevant thin film formed on the titanium nitride thin film 70 according to the prior art method and having poor step coverage.

The devices indicated in FIGS. 4 and 5 were subjected to a heat treatment at 470° C. for 10 hours and the contact resistances thereof were measured. The contact resistances in the contact hole having a diameter of 0.7 $\mu$m in the device indicated in FIG. 4 according to the present invention was 275 $\Omega$, while that of the prior art device indicated in FIG. 5 was 380 $\Omega$. Since the thickness of the titanium nitride thin film 64 in the device according to the present invention is larger than 80% of that formed on the flat portion even within the contact hole 62, it has an excellent property as a barrier. If the smallest thickness of the film formed by the prior art sputtering method within the contact hole should be equal to that in the device according to the present invention, it is very difficult to form the thin film principally made of aluminium within the contact hole. Further this gives rise to another problem that the processing precision decreases because of the thickness of the lamination layer consisting of the thin film principally made of aluminium and the titanium nitride thin film. For this reason it is almost impossible to apply it to far miniaturized semiconductor devices.

The reliability of the semiconductor device, in which the titanium nitride thin film according to the present invention is used, is increased with respect to that of the prior art device and it can be achieved to obtain a high performance device.

Embodiment 3

This embodiment will be explained, referring to FIG. 6. This is an embodiment, in which the present invention is applied to a complementary MOS semiconductor device provided with a memory circuit including MOS type elements provided with stacked type capacitors.

Figure 6:
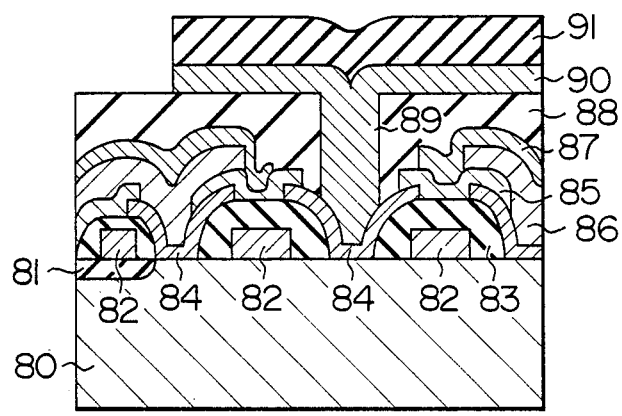
FIG. 6 is a cross-sectional view of another embodiment of the present invention; still another embodiment of the present invention.

In FIG. 6 a field oxide film 81 0.3 μm thick is formed on the principal surface of a silicon substrate 80 and there are disposed gates and a wiring layer 82 made of polycrystalline silicon doped with impurity. The length of all the gates is 0.7 μm. A thin film 83 principally made of silicon dioxide was formed on the gates and a wiring layer 82 and subjected to necessary processings. Thereafter a titanium nitride thin film 84 was formed by the method and under the conditions identical to those described in Embodiment 1. The titanium nitride thin film 84 is 120 nm thick. Further a silicon dioxide thin film 85 and a polycrystalline silicon thin film 86 doped with impurity was formed and subjected to necessary processings. After a lamination layer 50 nm thick, consisting of a silicon dioxide thin film and a silicon nitride thin film and serving as a dielectric film of a capacitor storing electric charge, was formed on the polycrystalline silicon thin film 86, a polycrystalline silicon thin film 87 doped with impurity was formed and subjected to necessary processings. The surface of an interlayer insulating film 88 is planarized, as indicated in FIG. 6, by formation of a thin film principally made of silicon dioxide including boron and phosphorus by the low pressure CVD method, flowing by heat treatment and being etched back thereof. After a contact hole 89 3 μm deep, whose diameter was 0.6 μm, was formed by the dry etching technique so that the side surface was almost perpendicular to the surface of the substrate 80, a titanium nitride film 90 was formed. The method for forming it is identical to that for forming the titanium nitride thin film 84 and the film thickness on the flat portion is 0.35 μm. The contact hole 89, whose diameter is 0.3 μm, is filled completely with the titanium nitride thin film 90. An aluminium alloy thin film 91 containing silicon at 1% and copper at 1.5% was formed on the titanium nitride thin film 90 by the sputtering method and subjected to necessary processings together with the titanium nitride thin film 90.

By a device according to this embodiment the access time was shortened by 15% and a high performance was obtained with respect to a prior art device, in which a polycrystalline silicon thin film was formed as the conductor layer 84 and the contact hole 89 was filled by etching back a polycrystalline silicon thin film formed by the CVD method. Further, in the case of a complementary MOS semiconductor device, as described in this embodiment contrary to the fact that it was thought necessary to impurity-dope the polycrystalline silicon buried in the contact hole, depending on the conductivity type (p or n) of the impurity in the contact portion such impurity doping was made unnecessary by burying titanium nitride therein. Further, in the case where polycrystalline silicon is used within the contact hole 89, boron or phosphorus contained in the thin film 88 principally made of silicon dioxide is diffused in the polycrystalline silicon during the heat treatment effected in order to planarize the surface of the relevant thin film by flowing. This gave rise to deficiencies, while in the device according to this embodiment such deficiencies were not produced. It is also possible to bury another conductor layer, e.g. tungsten, in the contact hole 89. In this case the titanium nitride thin film 84 acts as a barrier layer preventing the reaction forming tungsten silicide during the heat treatment.

A semiconductor device using the titanium nitride thin film according to the present invention has a higher performance and a higher reliability with respect to a prior art device.

Although the present invention is efficient particularly for semiconductor devices having abrupt steps at the surface thereof, as indicated in Embodiments 1 to 3, it is a matter of course that the effect can be obtained to improve the performance and the reliability also in the case where the present invention is applied to other electronic circuit devices. It is obvious also that a similar effect can be obtained for electronic devices provided with such electronic circuit devices.

Embodiment 4

Figure 7A:
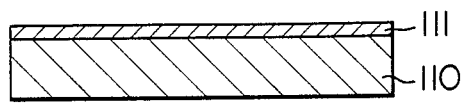
FIGS. 7a and 7b are cross-sectional views of still another embodiment of the present invention.

This embodiment will be explained, referring to FIGS. 7a, 7b and 8. FIG. 7a shows a sample, in which a titanium nitride film 111 is formed (on a silicon substrate 110, of (100) orientation doped with boron, having resistivity of 0.1 Ω·cm) by the low pressure CVD method, by means of an apparatus illustrated in FIG. 8.

Figure 8:
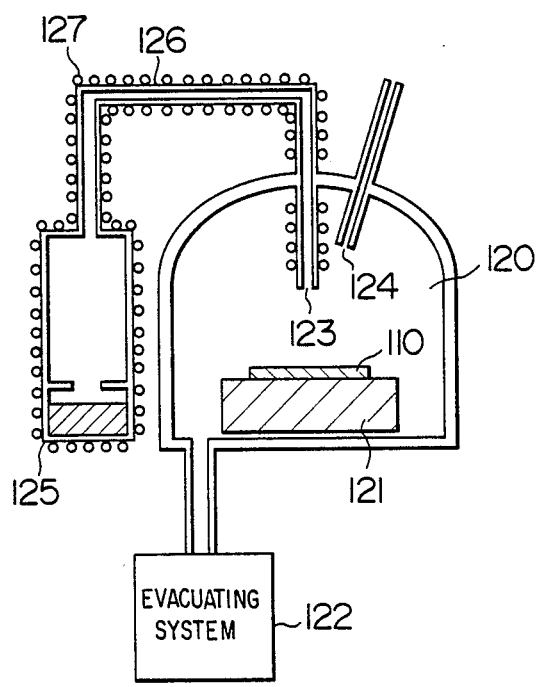
FIG. 8 is a cross-sectional view of an apparatus used for fabricating the device indicated in FIGS. 7a and 7b.

The silicon substrate 110 was placed on a substrate holder 121, in which a heater is buried, in a reaction chamber 120 of the apparatus illustrated in FIG. 8 and the reaction chamber 120 was evacuated to $3.0 \times 10^{-3}$ Torr by an evacuating system 122 consisting of a liquid nitrogen trap, a mechanical booster pump and a rotary pump. Thereafter the heater (not shown in the figure) in the substrate holder 121 was fed with electric current so that the surface temperature of the silicon substrate 110 was raised to 450° C. Next bis-cyclopentadienyl titanium and ammonia were introduced in the reaction chamber 120 through gas nozzles 123 and 124, respectively. Bis-cyclopentadienyl titanium was vaporized in a vaporizing vessel 125 and introduced in the reaction chamber The temperature of the vaporizing vessel 125 and the introducing piping 126 is kept to 80° C. by a sheath heater 127. 10 SCCM of the bis-cyclopentadienyl compound and 600 SCCM of ammonia were introduced therein and the pressure within the reaction chamber 120 was kept to 0.3 Torr. A titanium nitride film 111 120 nm thick was formed on the silicon substrate 110 for 5 minutes. Then the gas introduction was intercepted; the feed of the heater with electric current was stopped; and the reaction chamber 120 was evacuated again to $3.0 \times 10^{-3}$ Torr After the substrate 110 was cooled to 100° C., it was taken out to the atmosphere and a sample illustrated in FIG. 7a was obtained. The resistivity of the titanium nitride film 111 was 115 μΩcm, which was as low as that obtained by the reactive sputtering method.

Figure 7B:
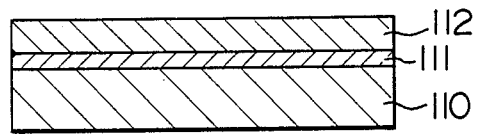

When an aluminium film 112 was formed on the sample indicated in FIG. 7a, a layer structure indicated in FIG. 7b was obtained. The aluminium film 112 was 0.7 μm thick.

The sample thus obtained was subjected to a heat treatment at 470° C. in 15 hours. The distribution of aluminium and silicon in the direction along the depth was measured by Auger electron spectroscopy and compared with measurement data obtained before the heat treatment. As the result it has become obvious that the progress of the mutual diffusion reaction between aluminium and silicon due to the heat treatment is at a level, which is lower than the detection limit by the Auger electron spectroscopy, and that the titanium nitride film 111 acts as an efficient barrier layer. When a sample, in which a titanium nitride film 111 having the same thickness was formed at a substrate temperature of 450° C by means of a CVD apparatus by the hot wall method by using titanium tetrachloride and ammonia as starting materials, was subjected to the heat treatment under the same conditions and the same measurement was effected by the Auger electron spectroscopy, it was observed that aluminium and silicon were diffused mutually. Accordingly it is clear that the titanium nitride film formed according to this embodiment was excellent in the barrier property. Further, according to this embodiment, since no ammonium chloride is produced within the apparatus, it is possible to fabricate clean semiconductor devices, on which no particles of ammonium chloride are attached.

It became obvious also that the barrier property is increased further, in the case where the substrate temperature at the formation of the titanium nitride film using a bis-cyclopentadienyl compound and ammonia as starting materials is higher than 450° C. in this embodiment. In addition it also became clear that in the case where the substrate temperatures are equal, the titanium nitride film according to the method using a bis-cyclopentadienyl compound has a higher barrier property than that formed using titanium tetrachloride. Consequently, even in the case where it is not necessary to form the titanium nitride film at a specifically low temperature, according to the method using a bis-cyclopentadienyl compound, no particles are produced and this method has a superiority to the method using titanium tetrachloride in that the barrier property is increased.

Embodiment 5

This embodiment will be explained, referring to FIGS. 9 and 10.

Figure 9:
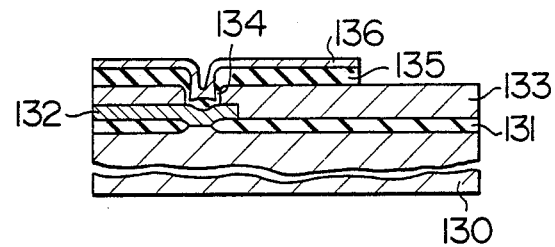
FIGS. 9 and 10 show a cross-sectional view of still another embodiment of the present invention and that of an apparatus used for fabricating the same, respectively.

In FIG. 9 a silicon dioxide film 131 is disposed on the surface of a silicon substrate 130, which film is formed selectively by the LOCOS method. A titanium nitride film 132 0.3 μm thick was formed on a silicon dioxide film 131 0.3 μm thick by means of an apparatus and by a method, which were similar to those used in Embodiment 4, and was patterned by using the usual photolithographic technique and the usual dry etching technique. The substrate temperature at the formation of the titanium nitride film 132 is 650° C. and the conditions for the formation of the film except for the substrate temperature are the same as those for Embodiment 4. A phosphosilicate glass (PSG) film 133 0.8 μm thick was formed on the titanium nitride film 132 thus obtained, by the atmospheric pressure CVD method, and a contact hole 134, whose diameter was 0.7 μm, was formed therein. Next an aluminium film 135 0.5 μm thick was formed thereon and a titanium nitride film 136 0.1 μm thick was superposed further thereon. The formation of the titanium nitride film 136 was carried out by the bias plasma CVD method by means of an apparatus indicated in FIG. 10.

Figure 10:
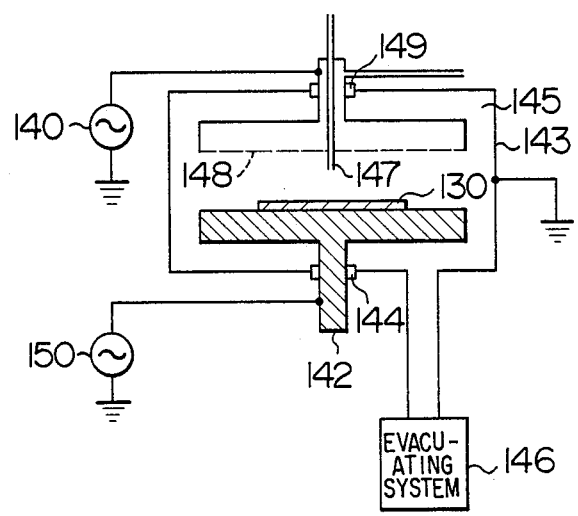

FIG. 10 shows a bias plasma CVD apparatus provided with a load locked chamber. The substrate 130 was placed on a substrate holder 142 through the transfer cell (not shown in the figure), to which it was possible to apply electric power by a high frequency power source 150 of 13.56 MHz. The substrate holder 142 is isolated from the grounded reaction chamber 143 by isolators noted as 144. The reaction chamber 145 was evacuated to $3 \times 10^{-6}$ Torr by an evacuating system 146 provided with a turbo molecular pump. After the temperature of the substrate 130 was raised to 350° C. by a heater buried in the substrate holder 142, biscyclopentadienyl titanium at 10 SCCM was introduced through a gas inlet 147 and ammonia at 300 SCCM and argon at 300 SCCM were introduced through a gas nozzle 148 in the reaction chamber 145 and the pressure in the reaction chamber was kept to be 0.3 Torr. The gas inlet 147 and the gas nozzle 148 are insulated from the grounded reaction chamber 143 by an insulator 149 so that it is possible to apply high frequency electric power of 13.56 MHz thereto from the power source 140. To apply electric power only to the substrate holder 142 using power source 150 enables formation of a TiN film with high step coverage. Additionally applying electric power to the gas inlet 147 and the gas nozzle 148, using power source 140 realize film formation at much lower temperatures such as 300° C. After the gas introduction was started and the pressure in the reaction chamber 145 was adjusted to 0.3 Torr, the apparatus was fed with electric power by the power sources 150. Consequently, an effective bias voltage of $-50$ V is applied to the substrate 130 through the substrate holder 142 by the power source 150. Such conditions were kept for 3 minutes and the titanium nitride film 136 0.1 μm thick was formed on the substrate 130, as indicated in FIG. 9, by the bias plasma CVD method. The step coverage of the titanium nitride film 136 thus formed was as good as that obtained in the case where titanium tetrachloride and ammonia were used as starting materials and improved significantly with respect to that obtained in the case where aminotitanium, etc. were used as starting materials. Patterning was made by the usual photolithographic technique and the usual dry etching technique at the same time for the titanium nitride film 136 and the aluminium film 135 constituting a lamination layer.

After a sample thus obtained was subjected to heat treatment in a hydrogen atmosphere at 450° C. for 30 minutes, the contact resistance of a contact hole having a diameter of 0.7 μm was measured and it was found that it was 310 mΩ, which is approximately equal to 318 mΩ obtained in the case where the titanium nitride film 32 formed by the prior art reactive sputtering method is used. Further the titanium nitride film 132 formed according to the present invention acted as an efficient barrier layer for preventing the reaction between the aluminium film 135 and the silicon substrate 130 during the heat treatment.

Next the breakdown voltage of a capacitor 10 μm square, which was fabricated on the semiconductor substrate 130 together therewith and in which a silicon dioxide was used as dielectric film, was measured and it was found that among 300 capacitors none of them was inferior in the breakdown voltage. Heretofore, in the case where the titanium nitride film 136 was formed on the aluminium film 135 by using titanium tetrachloride and ammonia as starting materials by means of the apparatus indicated in FIG. 10 by the no-bias plasma CVD method, 19 of similar 300 capacitors were inferior in the breakdown voltage. According to the method for forming a titanium nitride film, since no particles of ammonium chloride are produced, it is possible to reduce remarkably the production yield of deficiencies due to particles, as described above.

Further the effect of the increase in the anti-electromigration and the anti-stress-migration property of the wiring layer due to the formation of the titanium nitride film 136 on the aluminium wiring 135 was remarkably increased with respect to that obtained in the case where a film, which was formed by the prior art no-bias plasma CVD method using titanium tetrachloride and ammonia as starting materials was used. The inventors of the present invention presume that this is an effect of the fact that the titanium nitride film obtained by the method according to the present invention contains no chlorine.

As indicated above, the effect obtained by the method for forming a thin film according to the present invention is not restricted to the titanium nitride film, but it is a matter of course that a similar effect can be obtained also in the case where the present invention is applied to the formation of a thin film of nitride of other transition metals.

Embodiment 6

Figure 11:
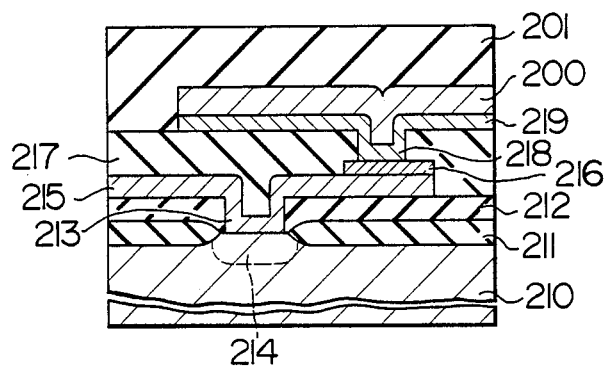
FIGS. 11 and 12 show a cross-sectional view of still another embodiment of the present invention and that of an apparatus used for fabricating the same, respectively.

This embodiment will be explained, referring to FIGS. 11 and 12. FIG. 11 is a cross-sectional view illustrating a part of a bipolar memory, to which the present invention is applied. On a silicon substrate 210 there is disposed a silicon dioxide film 211 formed selectively by the LOCOS method and further thereon a phosphosilicate glass film 212 is formed by the atmospheric pressure CVD method. After a contact hole 213 was opened and a diffusion layer 214 was formed, a wiring layer 215 made of polycrystalline silicon doped with impurity was fabricated. Thereafter a platinum silicide layer 216 70 nm thick was disposed on a part of the polycrystalline silicon wiring layer 215. The platinum silicide layer 216 was formed by producing a silicide forming reaction by a heat treatment after having deposited platinum by evaporation on the polycrystalline silicon wiring layer and patterning the platinum thereon. A silicon dioxide film 217 800 nm thick was formed by the bias sputtering method and a via hole 218 was opened.

The diameter of the via hole 218 is 0.8 μm. A titanium nitride film was formed on the silicon substrate 210 thus prepared by means of an apparatus indicated in FIG. 12.

Figure 12:
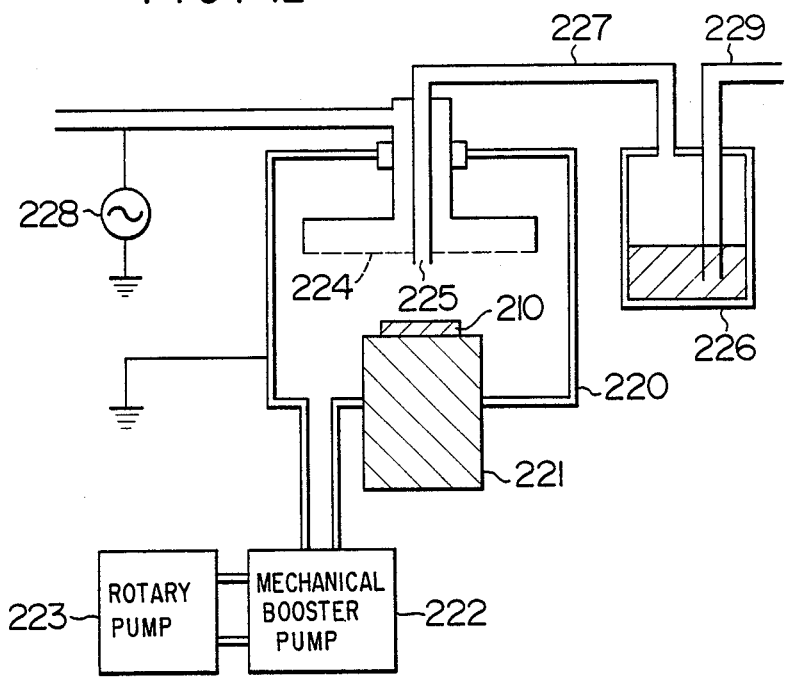

The substrate 210 was transferred from the transfer cell (not shown in the figure) of the apparatus indicated in FIG. 12 to a substrate holder 221, in which a heating lamp was included, within the reaction chamber 220. The reaction chamber 220 is evacuated to $2.0 \times 10^{-3}$ Torr by a mechanical booster pump 222 and a rotary pump 223. After the temperature of the substrate was raised to 600° C. by the heating lamp, ammonia was introduced through a gas nozzle 224 and titanium tetrachloride was introduced through a gas inlet 225 in the reaction chamber 220 together with H$_2$ carrier gas fed through the pipe 229 and a titanium nitride film was formed on the substrate 210 by the low pressure CVD method. The flow rate of H$_2$ carrier gas was 30 SCCM and the flow rate of ammonia was 1 SLM. During the formation of the film the pressure in the reaction chamber 220 was kept to be 0.25 Torr. Titanium tetrachloride was vaporized within a vessel 226 kept at 25° C. and introduced through the gas inlet 225 on the substrate 210 via the pipe 227 kept at 45° C. together with H$_2$. Further the inner wall of the reaction chamber 220 was heated to 100 to 150° C. by means of a heater in order to prevent the deposition of ammonium chloride on the inner wall of the reaction chamber 220. After these conditions were held for 5 minutes, the introduction of ammonia and titanium tetrachloride was stopped. Then the feed of the heating lamp in the substrate holder 221 with electric current was stopped and the reaction chamber 220 was purged with nitrogen. After the substrate 210 was cooled to 100° C. in nitrogen, it was transferred to the transfer cell and further taken out in the atmosphere. The crystallographic orientation of the titanium nitride film was measured by the X-ray diffraction method. The main orientation was (200). The peak of the X-ray diffraction corresponding to (200) had an intensity, which was more than 80 times as high as other peaks such as (111), etc. The crystallographic orientation of a titanium nitride film formed on a (100) silicon substrate by a similar method and under similar conditions is almost identical and it can be said that there are almost no influences of the underlayer. Further the resistivity of the film is 100 μΩ·cm. The contents of oxygen and carbon in the film are lower than 1 at % and 3 at %, respectively.

An aluminium alloy film 200 containing silicon at 1.5% and copper at 0.5% was formed by the sputtering method on the titanium nitride film 219 120 nm thick thus formed and the aluminium alloy film and the titanium nitride film constituting a lamination layer were processed at the same time by the usual photolithographic technique and the usual dry etching technique so as to form a lamination wiring layer. Thereafter a silicon nitride passivation film 201 1.5 μm thick was formed by the bias sputtering method and further the sample was subjected to a heat treatment at 450° C. for 1 hour in a hydrogen atmosphere.

The Schottky barrier height of a Schottky diode formed between the platinum silicide layer 216 and the polycrystalline silicon layer 215 was measured. The measurement was effected for 100 samples thus obtained and it was found that the Schottky barrier height was about 0.75 eV on the average, the minimum being 0.72 eV, the maximum being 0.78 eV. When similar measurements were effected, using a titanium nitride film having the same thickness and formed by the prior art reactive sputtering method, the principal orientation of the film being (111), the resistivity thereof being 120 μΩ·cm, the average value of the Schottky barrier height was 0.62 eV, the minimum being 0.47 eV, the maximum being 0.67 eV. It is presumed that the insufficiency in the barrier property (in the case where a titanium nitride film formed by the prior art reactive sputtering method, whose principal orientation is (111), is caused by the fact that mutual diffusion reaction is produced between the aluminium alloy wiring layer 220 and the polycrystalline silicon wiring layer 215 during the heat treatment at 450° C. for 1 hour. By using a film, whose principal orientation is (200), it has become possible to fabricate bipolar memories having no thermal deterioration in Schottky diodes used therein.

Further the apparatus indicated in FIG. 12 is provided with a high frequency power source 228 of 13.56 MHz, by means of which apparatus it is possible also to form films by the plasma CVD method. In the case where a titanium nitride film is formed having the same film thickness and formed by the plasma CVD method at a substrate temperature of 450° C., whose principal orientation is (200), the average value of the Schottky barrier height of 200 Schottky diodes indicated in FIG. 11 was 0.68 eV. In this case also the barrier property was improved with respect to that of a film formed by the prior art reactive sputtering method. The barrier property of a film formed by the bias plasma CVD method while applying a bias to the substrate was approximately equal to that obtained by the low pressure CVD method according to this embodiment.

Although in this embodiment a titanium nitride barrier layer was used in the via hole portion between the polycrystalline silicon wiring layer or the platinum silicide layer and the aluminium alloy wiring layer, it is a matter of course that a similar effect can be also obtained when it is used in a contact hole portion between the silicon substrate and the aluminium alloy wiring layer, etc. In addition the inventors of the present invention have found that the titanium nitride film has the same surface orientation and that an equivalent effect can be also obtained in the case where the film is formed by using materials other than titanium tetrachloride and ammonia described in this embodiment, such as titanium tetrachloride and nitrogen, etc. as starting materials.

Embodiment 7

Figure 13:
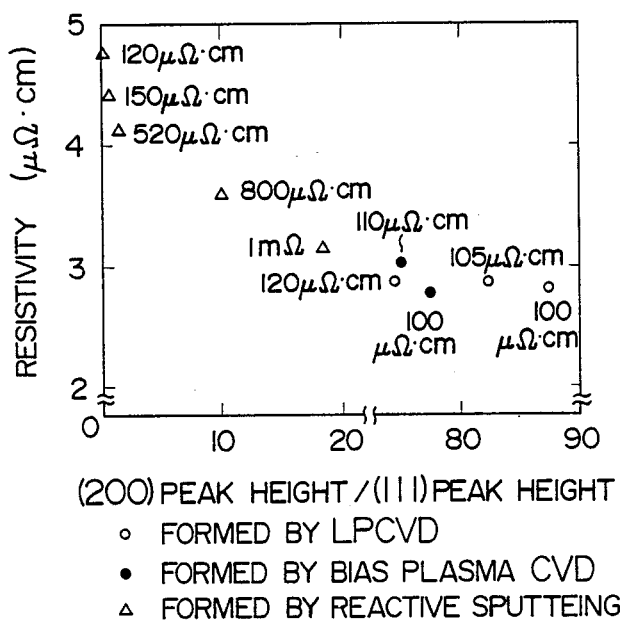
FIG. 13 is a diagram indicating an example of the effect of the present invention.

This embodiment will be explained, referring to FIG. 13. FIG. 13 is a scheme for explaining the effect to improve the barrier property by the present invention. All the data in the figure concern samples, in which a titanium nitride film 100 nm thick is formed on a (100) silicon substrate and further an aluminium film 500 nm thick is superposed thereon and the resistivities of aluminium are values obtained after having subjected the samples to a heat treatment in a nitrogen atmosphere at 450° C. for 10 hours.

The abscissa in FIG. 13 represents the ratio of the height of the peak from $2\theta \delta 42.9°$ corresponding to (200) orientation to the height of the peak from $2\theta \delta 36.8°$ corresponding to (111) orientation of the titanium nitride film measured by the X-ray diffraction method just after the as formation of the titanium nitride film. The ordinate indicates the resistivity (value after the heat treatment) of a pure aluminium film 500 nm thick formed on the titanium nitride film, the resistivity before the heat treatment being 2.75 $\mu\Omega \cdot cm$.

O indicates data of a sample using a titanium nitride film formed by the low pressure CVD method; ●those formed by the bias plasma CVD method; and △ those formed by the reactive sputtering method. The resistivity of the titanium nitride film shown in the figure is the value just after the formation of the titanium nitride film.

As it is clearly seen from FIG. 13, the increase in the resistivity of the aluminium film after the heat treatment is reduced with increasing degree of the component of (200) orientation. That is, the films, whose principal orientation is (200) and which have values greater than 10 on the abscissa, have a high barrier property, which indicates a remarkable effect to prevent the mutual diffusion reaction between the silicon substrate and the aluminium film.

Further, although also for the titanium nitride film formed by the reactive sputtering method the barrier property increases with increasing degree of the component of (200) orientation, it can be seen from FIG. 13 also that the resistivity of the titanium nitride film increases. On the contrary the film formed by the low pressure CVD method or by the bias plasma CVD method has a low resistivity and at the same time it is excellent in the barrier property.

Embodiment 8

Figure 14A:
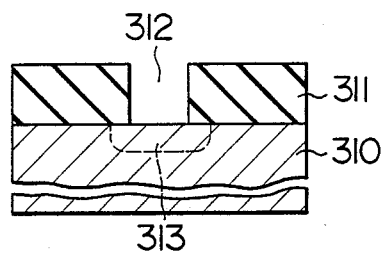
FIGS. 14a to 14c are cross-sectional views of still another embodiment of the present invention.

This embodiment will be explained referring to FIGS. 14a to 14c, 15. FIG. 14a shows a p type silicon substrate 310 having a resistivity of about 10 $\Omega$cm, on which a silicon dioxide film 311, 1 $\mu$m thick is formed by the CVD method. A contact hole 312 having a diameter of 0.8 $\mu$m is formed in the silicon dioxide film. Boron ions are implanted in the opening portion of the silicon substrate 310 after the formation of the contact hole 312 so that a p+ region 313 is formed there. A titanium nitride film was formed on the silicon substrate 310 thus prepared by means of a low pressure CVD apparatus indicated in FIG. 15.

Figure 15:
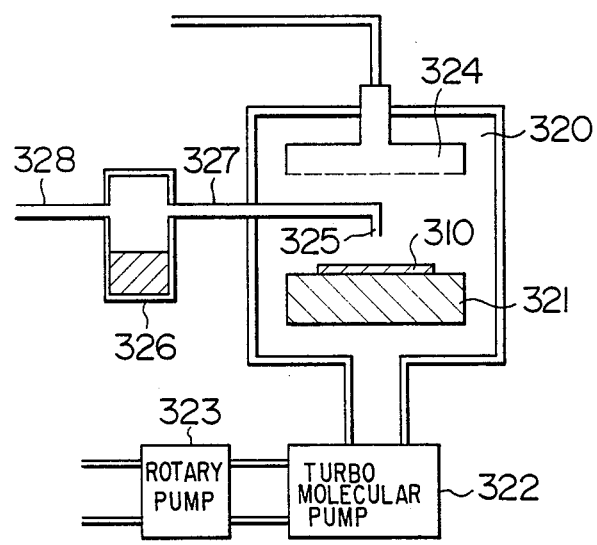
FIG. 15 is a cross-sectional view of an apparatus used for fabricating the device indicated in FIGS. 14a to 14c.

After the substrate 310 was placed on a substrate holder 321, in which a heater was buried, in a reaction chamber 320 of the apparatus indicated in FIG. 15, the reaction chamber 320 was evacuated by a turbo molecular pump 322 and a rotary pump 323. After the reaction chamber 320 was evacuated to $3.0 \times 10^{-6}$ Torr, the heater (not shown in the figure) buried in the substrate holder 321 was fed with electric current so as to raise the temperature of the substrate to 550° C. Thereafter titanium tetrachloride was introduced through a gas inlet 325 together with $H_2$ carrier gas from the pipe 328 in the reaction chamber 320 so as to form a thin Ti layer. Then ammonia was introduced through a gas nozzle 324 so as to form a titanium nitride film on the substrate 310 by the low pressure CVD method. The flow rate of titanium tetrachloride was 10 SCCM and that of ammonia was 900 SCCM and the pressure within the reaction chamber 320 was kept at 0.35 Torr during the formation of the film. Titanium tetrachloride was vaporized in a vessel 326 kept at 30° C. and introduced through the gas inlet 325 together with $H_2$ carrier gas from the pipe inlet 328 in the reaction chamber 320 via a pipe 327 kept at 50° C. Further the inner wall of the reaction chamber 320 was heated to 120° C. by a heater disposed on the outer wall of the reaction chamber 320 in order to restrain the formation of ammonia chloride thereon. After the conditions described above were maintained for five minutes, the introduction of ammonia and titanium tetrachloride and the feed of the heater in the substrate holder 321 was stopped. The reaction chamber 320 was evacuated again to about $3.0 \times 10^{-6}$ Torr. After the substrate 310 was cooled to 150° C. in the reaction chamber 320, it was taken out therefrom to the atmosphere.

Figure 14B:
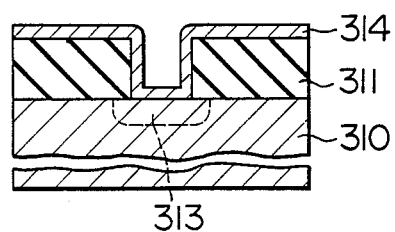
Figure 14C:
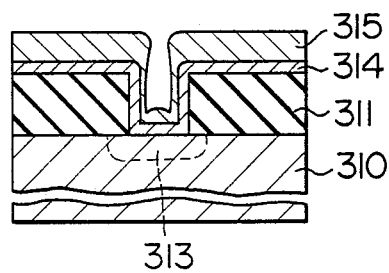

FIG. 14b shows the silicon substrate 310 after having formed the titanium nitride film 314 by the procedure described above. (The Ti layer under the TiN layer is very thin and is not shown in the figure.) The titanium nitride film 314 is 150 nm thick. The inner stress of the titanium nitride film, obtained by forming a titanium nitride film on a silicon substrate 200 $\mu$m thick having a diameter of 2 inches (5.08 cm) and calculating on the basis of the difference between warps before and after the formation of the film, was a tensile stress of 0.77 GPa. An aluminium alloy film 315 500 nm thick containing Si at 1.5% was formed on the titanium nitride film 314 thus prepared by the sputtering method and a sample indicated in FIG. 14c was obtained. Thereafter a lamination wiring layer was formed by subjecting at the same time the aluminium alloy film 315 and the titanium nitride film 314 to patterning by the usual photolithographic technique, the usual dry etching technique, etc. A silicon nitride passivation film 500 nm thick was formed on the whole surface by the plasma CVD method.

The contact resistance of the contact hole having a diameter of 0.8 $\mu$m in a sample thus prepared was measured and it was found that it was 250 $\Omega$. The thin Ti layer might be effective to lower the contact resistance.

On the contrary, the contact resistance of the contact hole having a diameter of 0.8 μm in a sample using a titanium nitride film subjected to compressive stress and having the same structure is 240 Ω. The formation of the titanium nitride film subjected to compressive stress was effected by the reactive sputtering method. The substrate temperature at the formation of the film is 150° C.

After the two samples using the titanium nitride films subjected to tensile and compressive stresses, respectively, underwent heat treatment at 500° C. for 10 hours contact resistances were measured again. The contact resistance of the contact hole having a diameter of 0.8 μm was 280 Ω for the sample using the titanium nitride film subjected to tensile stress and 410 Ω for the sample using the titanium nitride film subjected to compressive stress. In this way it was confirmed that the titanium nitride film subjected to tensile stress has a higher barrier property at the contact hole portion.

On the other hand, a high temperature aging test with electric current and a high temperature aging test without electric current were effected for lamination layer wiring in samples according to two different specifications using titanium nitride films subjected to tensile and compressive stresses, respectively. In all the cases the width of the tested lamination layer wiring is 1 μm.

The conditions for the high temperature aging test with electric current are that the ambient temperature is 250° C. and that the current density is $2.0 \times 10^6$ A/cm$^2$. For each of the specifications 200 samples were tested. The mean time to failure of the samples using the titanium nitride film subjected to tensile stress was 8.3 hours, which was significantly longer than the mean time to failure of 5.7 hours of the samples using the titanium nitride film subjected to compressive stress. By using the titanium nitride subjected to tensile stress it was possible to increase the anti-electromigration property of the lamination wiring layer made of aluminium alloy and titanium nitride.

The condition for the high temperature aging test without electric current is that the ambient temperature is 250° C. The mean time to failure of 200 samples using the titanium nitride film subjected to tensile stress was 283 hours, while that of 200 samples using the titanium nitride film subjected to compressive stress was 107 hours. By using the titanium nitride film subjected to tensile stress it was possible to increase significantly the anti-stress-migration property of the lamination wiring layer of aluminium alloy and titanium nitride. Furthermore it was possible to obtain an equivalent effect also in the case where other materials such as titanium tetrachloride and nitrogen, etc. were used as starting materials for the titanium nitride film.

In addition, when a tungsten nitride film, whose inner stress was tensile stress, was formed by the low pressure CVD method using tungsten hexafluoride and ammonia as starting materials by means of the apparatus indicated in FIG. 15, it was recognized that it was more excellent in the barrier property than the film, whose inner stress was compressive stress, formed by the reactive sputtering method. Further, both the anti-electromigration property and the anti-stress-migration property were higher in the case where the tungsten nitride film subjected to tensile stress was used than in the case where the film subjected to compressive stress was used. Furthermore it was possible to obtain an equivalent effect also in the case where other materials such as tungsten hexafluoride and nitrogen, etc. were used as starting materials for the tungsten nitride film.

The formation of the titanium nitride film and the tungsten nitride film, whose inner stress is tensile stress, is possible, apart from the low pressure CVD method, also by the plasma CVD method. Further it is also possible to form them by the bias plasma CVD method (plasma CVD method effected while applying a bias voltage to the substrate. The film formed by the bias plasma CVD is more excellent in high density and the barrier property than the film formed by the plasma CVD. Furthermore it was possible to form the film, whose inner stress is tensile stress, also by forming the film, while maintaining the substrate temperature to be higher than 600° C. By the film formed by either one of the methods and subjected to tensile stress an effect was obtained, which was similar to that obtained by using the titanium nitride film formed by the low pressure CVD method described in this embodiment.

As explained in detail in the, above according to the present invention it has become possible to form a titanium nitride film, which was excellent in the barrier property and had a high step coverage, on the inner surface of a considerably fine hole and to form a fine semiconductor device having a high reliability, which was heretofore difficult to realize.

According to the present invention it is necessary to form the titanium nitride film by the low pressure CVD method by means of a cold wall type CVD apparatus. By the atmospheric pressure CVD method, it is difficult to form a titanium nitride film in a hole, whose diameter or width is smaller than 1 μm and whose aspect ratio (depth of hole/diameter or width of hole) is greater than 0.7, with a high step coverage. Further, when a hot wall type CVD apparatus, in which the temperature of the wall surface of the reaction chamber is higher than the substrate temperature, is used, even if the gas pressure in the reaction chamber is lower than the atmospheric pressure and the titanium nitride film is formed by the low pressure CVD method, not only is it not possible to obtain any satisfactory step coverage, but also characteristics as a barrier for preventing the reaction between silicon and aluminium are reduced. Consequently it is important to form the titanium nitride film by the low pressure CVD by means of a cold wall type CVD apparatus, in which the temperature of the wall surface of the reaction chamber is lower than the temperature of the semiconductor substrate.

According to the present invention, it is desirable that the titanium nitride film is between 5 nm and 0.7 μm at the portion formed on the insulating film outside of the groove. When the film thickness at this portion is smaller than 5 nm, characteristics as a barrier are insufficient, and when it is larger than 0.7 μm, cracks are easily produced.

Further it is desirable that the temperature of the semiconductor substrate at the formation of the titanium nitride film is between 400° C. and 900° C. When the temperature at this time is lower than 400° C., the titanium nitride film is apt to be cracked by the heat treatment effected in following steps, and on the contrary, when the temperature is higher than 900° C., cracks are easily produced at the cooling after deposition of the titanium nitride film. In addition it is desirable that the temperature of the wall surface of the reaction chamber at the formation of the titanium nitride film is lower by more than 300° C. than the temperature of the semiconductor substrate. When the temperature difference between them becomes small, the effect obtained by using the cold wall type CVD apparatus is reduced and the step coverage of the titanium nitride film as well as the characteristics as a barrier are lowered. It is desirable also that the pressure in the reaction chamber at the formation of the titanium nitride film is between 0.05 Torr and 1 Torr. When the pressure disclosed above is lower than 0.05 Torr, the deposition speed of titanium nitride is significantly lowered and the characteristics of the film are deteriorated by mixing of oxygen, etc. On the contrary, when it is higher than 1 Torr, it is difficult to form the titanium nitride film in a fine hole having a large aspect ratio. Further, as the aluminium alloy described above, various sorts of aluminium alloys, such as Al-Si alloy, Al-Cu alloy, Al-Mn alloy, etc., which are used as wiring materials in semiconductor devices, can be utilized.

What is claimed is:

1. A semiconductor device comprising:
an insulating film, having a surface, formed on a surface of a semiconductor substrate, and having at least a hole whose side wall is substantially perpendicular to said substrate surface; and
a titanium nitride film disposed thereon, extending from the surface of said semiconductor substrate, exposed by said hole, along said side wall, and having a portion on the insulating film surface, said titanium nitride film extending along said side wall having a thinnest portion, the portion of the titanium nitride film on the insulating film surface having a film thickness, the thickness of said thinnest portion of said titanium nitride film within said hole, being more than 0.6 times as large as the film thickness of the titanium nitride film portion on said insulating film surface.

2. A semiconductor device comprising:
an insulating film, having a surface, formed on a surface of a semiconductor substrate, and having at least a hole whose diameter is smaller than 1 μm, the hole having an aspect ratio, the aspect ratio of the hole being greater than 0.7, the hole having a side wall that is substantially perpendicular to said substrate surface; and
a titanium nitride film disposed thereon, extending from the surface of said semiconductor substrate, exposed by said hole, along said side wall, and having a portion on the insulating film surface, said titanium nitride film extending along said side wall having a thinnest portion, the portion of the titanium nitride film on the insulating film surface having a film thickness, the thickness of said thinnest portion of said titanium nitride film, within said hole, being more than 0.6 times as large as the film thickness of the titanium nitride film portion on said insulating film surface.

3. A semiconductor device according to claim 2, wherein the thickness of said titanium nitride film on said insulating film is between 5 nm and 700 nm.

4. A semiconductor device according to claim 2, wherein a film made of a material selected from the group consisting of aluminum and aluminum alloys is superposed on said titanium nitride film.

5. A semiconductor device according to claim 1, wherein the titanium nitride film includes chlorine in an amount of at most 2 at %.

6. A semiconductor device according to claim 1, wherein the device is a memory cell including a trench-shaped capacitor, and said titanium nitride film constitutes an electrode of said trench-shaped capacitor.

7. A semiconductor device according to claim 6, wherein the titanium nitride film has an insulating material film thereon serving as a dielectric film of the trench-shaped capacitor.

8. A semiconductor device according to claim 1, wherein the surface of the semiconductor substrate exposed in the hole is a surface of an impurity-containing region provided in the substrate, the titanium nitride film being provided in direct contact with said impurity-containing region.

9. A semiconductor device according to claim 8, further comprising a conductive film made of a material selected from the group consisting of aluminum and aluminum alloys positioned on the titanium nitride film, the titanium nitride film acting as a barrier layer between the conductive film and the impurity-containing region provided in the substrate.

10. A semiconductor device according to claim 1, wherein the titanium nitride film has a principal orientation of (200).

11. A semiconductor device according to claim 10, wherein the ratio of (200) peak height to (111) peak height, for orientation of the titanium nitride film, is greater than 10.

12. A semiconductor device according to claim 1, wherein the titanium nitride film has an inner stress that is a tensile stress.

* * * * *